United States Patent
So et al.

(10) Patent No.: US 7,157,928 B2
(45) Date of Patent: Jan. 2, 2007

(54) DETERMINING LEAKAGE IN MATRIX-STRUCTURED ELECTRONIC DEVICES

(75) Inventors: Franky So, San Jose, CA (US); Florian Pschenitzka, San Jose, CA (US); Egbert Hoefling, Penang (MY)

(73) Assignee: Osram Opto Semiconductors GmbH, Regensburg (DE)

( * ) Notice: Subject to any disclaimer, the term of this patent is extended or adjusted under 35 U.S.C. 154(b) by 2 days.

(21) Appl. No.: 10/952,601

(22) Filed: Sep. 28, 2004

(65) Prior Publication Data
US 2005/0258859 A1    Nov. 24, 2005

Related U.S. Application Data

(60) Provisional application No. 60/573,074, filed on May 21, 2004.

(51) Int. Cl.
*G01R 31/00* (2006.01)
(52) U.S. Cl. .................................................. 324/770
(58) Field of Classification Search .................. None
See application file for complete search history.

(56) References Cited

U.S. PATENT DOCUMENTS

| | | | | |
|---|---|---|---|---|
| 5,377,030 A | * | 12/1994 | Suzuki et al. | 349/187 |
| 5,608,558 A | * | 3/1997 | Katsumi | 349/192 |
| 6,633,135 B1 | * | 10/2003 | Nara et al. | 315/169.3 |
| 6,864,703 B1 | * | 3/2005 | Miyagawa et al. | 324/770 |
| 6,930,505 B1 | * | 8/2005 | Taguchi et al. | 324/770 |
| 6,987,400 B1 | * | 1/2006 | Toro-Lira | 324/770 |

FOREIGN PATENT DOCUMENTS

JP        10-321367        * 12/1998

* cited by examiner

*Primary Examiner*—Ernest Karlsen
(74) *Attorney, Agent, or Firm*—Cohen, Pontani, Lieberman & Pavane

(57) ABSTRACT

One embodiment of this invention pertains to a high throughput screening technique to identify current leakage in matrix-structured electronic devices. Because elements that are likely to develop a short have relatively high leakage current at zero operation hours, by identifying elements with the relatively high leakage current, the electronic devices that are more likely to later develop a short can be differentiated. The screening technique includes performing the following actions: selecting one of multiple first lines; applying a first voltage to the selected first line; applying a second voltage to the one or more of the first lines that are not selected; floating the multiple second lines; and measuring the voltages on the second lines, either sequentially one line at a time or measuring all the lines at the same time.

21 Claims, 6 Drawing Sheets

FIG. 4

|    | B1   | B2   | B3   | B4   | B5   |
|----|------|------|------|------|------|
| A1 | 2.5V | 2.5V | 2.5V | 2.5V | 3.5V |
| A2 | 2.5V | 2.5V | 2.5V | 2.5V | 1.5V |
| A3 | 2.5V | 2.5V | 2.5V | 2.5V | 3.5V |
| A4 | 2.5V | 2.5V | 2.5V | 2.5V | 3.5V |
| A5 | 2.5V | 2.5V | 2.5V | 2.5V | 3.5V |

FIG. 6

|             | B1 | B2 | B3 | B4 | B5  |
|-------------|----|----|----|----|-----|
| E2,j − E1,j | 0V | 0V | 0V | 0V | −2V |
| E3,j − E2,j | 0V | 0V | 0V | 0V | 2V  |
| E4,j − E3,j | 0V | 0V | 0V | 0V | 0V  |
| E5,j − E4,j | 0V | 0V | 0V | 0V | 0V  |

DETERMINING LEAKAGE IN MATRIX-STRUCTURED ELECTRONIC DEVICES

CROSS-REFERENCE TO RELATED APPLICATIONS

This application claims benefit of U.S. Provisional Patent Application having the Application No. 60/573,074 filed on May 21, 2004 and entitled "Determining Leakage in Matrix-Structured Electronic Devices."

BACKGROUND OF THE INVENTION

An organic light emitting diode ("OLED") display typically includes, in sequence: (1) a transparent anode (e.g., the anode can be comprised of indium tin oxide ("ITO")); (2) a hole transporting layer ("HTL"); (3) an electron transporting and light emitting layer ("emissive layer"); and (4) a cathode. When a forward bias is applied, holes are injected from the anode into the HTL, and the electrons are injected from the cathode into the emissive layer. Both carriers are then transported towards the opposite electrode and allowed to recombine with each other in the device, the location of which is called the recombination zone; the recombinations in the emissive layer produce visible light. In an OLED display, each intersection of the anode and cathode is referred to as a pixel (e.g., an electroluminescent ("EL") element) from which light can be emitted.

Anode-cathode shorts within a pixel ("pixel shorts") are one of the major causes for failure of passive matrix OLED devices. Under multiplexed operation a pixel short becomes visible as a black pixel combined with a bright column or bright row effect. The pixel short lowers the display quality and may even render the display unusable. The pixel short can be caused by, for example, substrate imperfections or asperities, anode layer irregularities, non-uniformity of the one or more organic layers, and airborne particles introduced in the element structure during handling. In most cases the short develops suddenly after a certain operation time. Pixels with risk of shorting usually have an increased reverse leakage current at zero operation hours. It is difficult to detect this leakage current due to the noise added by the multitude of pixels that are in parallel to the pixel to be measured.

In case of OLED displays, the measurement of pixel related leakage becomes particularly important, since there is a high probability that leaky pixels will develop into pixel shorts. Similar measurements are important for other matrix-structured devices such as, for example, memory circuits, active matrix displays, detector arrays, and solar cell arrays. The leakage current of a single pixel can be very small (sometimes less than 1 nA). It is difficult and time consuming to detect such a small leakage current in each pixel of a display that has thousands of pixels. There is a need to develop a fast and accurate technique to measure pixel leakage currents less than 10 nA (or 10 uA/cm$^2$).

Therefore, it is desirable to have a fast technique to accurately measure a signal which is a suitable indicator for the pixel leakage currents of a newly fabricated display so as to identify those pixels that are later likely to develop pixel shorts.

BRIEF DESCRIPTION OF THE DRAWINGS

FIG. 4 is a table that shows exemplary measured voltages of the EL elements of the exemplary display.

FIG. 6 shows the voltage differences between the selected element and an adjacent immediately preceding element for the exemplary display.

DETAILED DESCRIPTION

Figure 1:
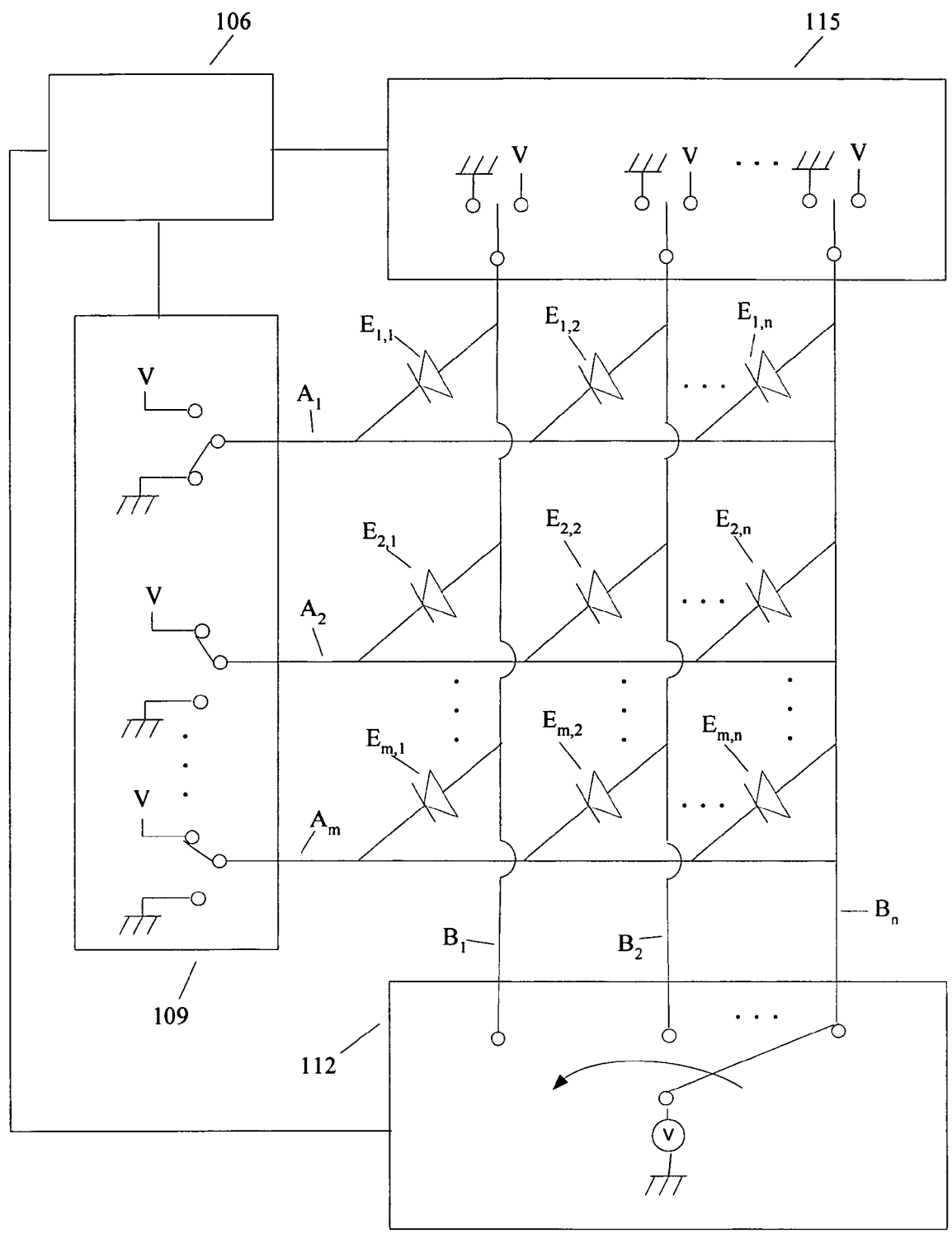
FIG. 1 shows an embodiment of a testing device according to the present invention.

A first embodiment of this invention pertains to a high throughput screening technique to identify current leakage in matrix-structured electronic devices. Because elements that are likely to develop a short have relatively high leakage current at zero operation hours, by identifying elements with the relatively high leakage current, the electronic devices that are more likely to later develop a short can be differentiated. The electronic devices can be, for example, passive matrix displays (e.g., OLED passive matrix displays where the active layers are comprised of organic polymers or small molecules; or inorganic LED passive matrix displays), light sources used for area illumination, active matrix displays, memory circuits, detector arrays, and solar cell arrays. The electronic device includes multiple elements (e.g., an EL element, a solar cell, or a photodetector cell), multiple first lines (e.g., cathode lines or anode lines), and multiple second lines (e.g., anode strips or cathode lines). The first lines and the second lines intersect and the elements are at the intersection of the first lines and the second lines. The elements are coupled to the first lines and the second lines. The screening technique includes performing the following actions: selecting one of the first lines; applying a first voltage to the selected first line; applying a second voltage to the one or more of the first lines that are not selected; floating the second lines; and measuring the voltages on the second lines, either sequentially one line at a time or measuring all the lines at the same time. The measured voltages across the second lines are the voltages of the corresponding elements that are coupled to both the selected first line and the corresponding second lines. In order to measure the voltages of all of the elements of the electronic device, these actions are performed for the remaining first lines so that all of the first lines are selected once. Various techniques use the measured voltages of the elements in order to, for example, identify particular leaky elements, or alternatively, to provide a binary answer (e.g., a "yes" or "no" answer) as to whether the electronic device contains any leaky elements. One technique, for example, compares the measured voltage of a particular element coupled to a particular second line with the "average column voltage" of the elements coupled to the same second line. Another technique determines the voltage difference between the measured voltages of two adjacent elements to determine if an element is leaky.

A second embodiment of the present invention pertains to using visual detection to identify one or more leaky EL elements (the active layers of the EL elements can be made of, for example, organic materials or inorganic materials), or alternatively, visual detection can be used to provide a binary answer as to whether the electronic device contains any leaky EL elements. The second embodiment of the screening technique includes performing the following actions: selecting one of the first lines; applying a first voltage to the selected first line; applying a second voltage to the one or more of the first lines that is not selected; floating the second lines; and visually determining if one or more of the EL elements coupled to the selected first line emits light. In order to traverse all of the EL elements of the device and determine whether any of the EL elements emit light, these actions are performed for the remaining first lines so that all of the first lines are selected once. If one of the EL elements coupled to a second line does not emit light but all the other EL elements coupled to the same second line emit light, then it can be concluded that the EL element which does not emit light is a leaky EL element. Alternatively, for the binary answer, while scanning the first lines, if any of the EL elements emit light, then it can be concluded that the electronic device contains at least one leaky element.

A third embodiment of the present invention pertains to using optical detection by employing an array of infrared sensors to identify one or more leaky elements in the electronic device.

While the matrix-structured electronic device can be, for example, any of the devices described earlier, in order to provide concrete descriptions and examples, the descriptions and examples below refer to a passive matrix OLED display.

FIG. 1 shows an embodiment of a testing device 103 according to the present invention. The testing device 103 includes a control unit 106, a line drive unit 109, a line drive unit 115, and a voltage measuring device 112 (e.g., this device can include one voltmeter or multiple voltmeters). The control unit 106 is coupled to the line drive unit 109, the line drive unit 115, and the voltage measuring device 112. The line drive unit 109 is coupled to cathode lines $A_1$ to $A_m$ (e.g., the cathode lines can be referred to generically as either the first lines or the second lines) of the OLED display, and the line drive unit 115 and the voltage measuring device 112 are coupled to anode lines $B_1$ to $B_n$ (e.g., the anode lines can be referred to generically as either the first lines or the second lines) of the OLED display. The cathode lines $A_1$ to $A_m$ are substantially parallel to each other, and the anode lines $B_1$ to $B_n$ are substantially parallel to each other. The cathode lines $A_1$ to $A_m$ intersect the anode lines $B_1$ to $B_n$. EL elements $E_{1,1}$ to $E_{m,n}$ are at the intersections of the cathode lines $A_1$ to $A_m$ and the anode lines $B_1$ to $B_n$. The control unit 106 directs the line drive unit 109 to apply, e.g., voltage "V", ground potential, or float the cathode lines $A_1$ to $A_m$. A line is floating if it is left open, e.g., it is not coupled to a voltage supply, a ground potential, or a current supply, but it can be coupled to a voltage meter. The control unit 106 directs the line drive unit 115 to apply, e.g., voltage "V", ground potential, or float the anode lines $B_1$ to $B_n$. The control unit 106 also directs the voltage measuring device 112 to either sequentially measure the voltages on the anode lines $B_1$ to $B_n$ one line at a time (as shown in FIG. 1), or to measure all at once the voltages on the anode lines $B_1$ to $B_n$.

Alternatively, the anode lines can be coupled to the line drive unit 109 and can be the lines that are multiplexed, while the cathode lines are coupled to the line drive unit 115 and the voltage measuring device 112 so that the voltages on the cathode lines can be measured.

Figure 2:
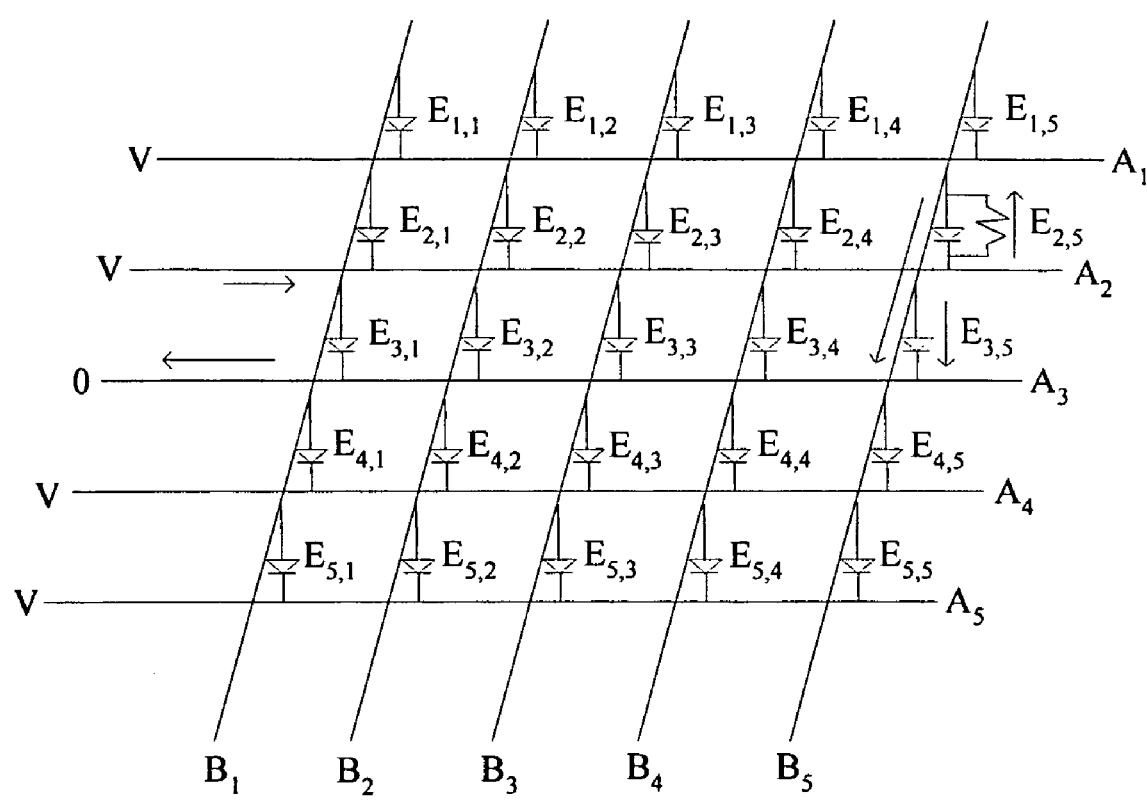
FIG. 2 shows an embodiment of a technique to measure the voltages of the EL elements according to the present invention.

FIG. 2 shows an embodiment of a technique to measure the voltages of the EL elements according to the present invention. During a scanning period, one of the multiple cathode lines $A_1$–$A_5$ is selected. In FIG. 2, cathode line $A_3$ is the selected cathode line, and the other cathode lines (i.e., $A_1$, $A_2$, $A_4$, and $A_5$) are the non-selected cathode lines. The voltage applied to the selected cathode line (i.e., $A_3$) is significantly lower than the voltage applied to the non-selected cathode lines (i.e., $A_1$, $A_2$, $A_4$, and $A_5$). The voltage is considered significantly lower if the voltage applied to the selected line is at least 6V lower than the voltage applied to the non-selected lines. For example, in FIG. 2, the voltage applied to the selected cathode line is 0V (i.e., the selected cathode line is grounded), and the voltage "V" applied to the non-selected cathode lines is 12V. The anode lines $B_1$–$B_5$ are floated. Then, the voltage on the anode lines $B_1$–$B_5$ are measured using the measuring device 112. The voltages on the anode lines $B_1$–$B_5$ can be measured sequentially one line at a time, or all of the voltages on the anode lines $B_1$–$B_5$ can be measured at the same time. The measured voltages on the anode lines are the voltages of the corresponding EL elements coupled to the selected cathode line. For example, in FIG. 2, the measured voltage on the anode line $B_1$ is the voltage of the EL element $E_{3,1}$; the measured voltage on the anode line $B_2$ is the voltage of EL element $E_{3,2}$; the measured voltage on the anode line $B_3$ is the voltage of EL element $E_{3,3}$; the measured voltage on the anode line $B_4$ is the voltage of EL element $E_{3,4}$; and the measured voltage on the anode line $B_5$ is the voltage of EL element $E_{3,5}$.

In FIG. 2, the EL elements coupled to the anode line $B_1$ have a small leakage current and thus the measured voltage on anode line $B_1$ will be close to the turn-on voltage of the EL element. Similarly, the measured voltages on the anode lines $B_2$–$B_4$ will also be close to the turn-on voltage. In contrast, the EL element $E_{2,5}$ is a leaky element (the leaky element is denoted by the resistor that is parallel to the element) and so there is a larger current passing through this element. The voltage "V" applied to cathode line $A_2$ will cause a significant current flow through the EL element $E_{2,5}$ and thus anode line $B_5$ will be at a significantly higher voltage "$V_5$" than the turn-on voltage and also higher than the voltage on any of the other anode lines (i.e., the measured voltage on anode line $B_5$ will be significantly higher than the measured voltages of any of the other anode lines $B_1$–$B_4$). Here, the voltage is considered to be significantly higher if its at least 100 mV higher. In this case, since the selected cathode line $A_3$ is at 0V and the voltage on the anode line $B_5$ will be significantly higher than the turn-on voltage of the EL element, the EL element $E_{3,5}$ will most likely emit light.

Figure 3:
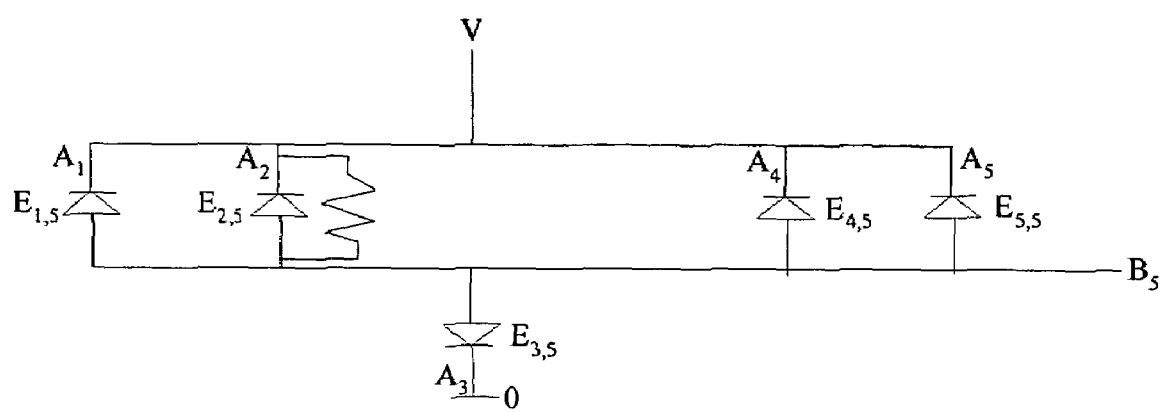
FIG. 3 shows an isolated view of anode line $B_5$.

FIG. 3 shows an isolated view of anode line $B_5$. In FIG. 3, EL element $E_{2,5}$ is a leaky element (the leaky element is denoted by the resistor in parallel to the element) and so there is a significantly higher current flow through the EL element $E_{2,5}$ than any of the other non-leaky elements. The leakage current results in the voltage on the anode line $B_5$ being significantly higher than the turn-on voltage of the element. In general, if the anode line is coupled to a leaky element but the selected cathode line is not coupled to the leaky element, then the voltage measured on the anode line will be significantly higher than the turn-on voltage; however, if the anode line is coupled to a leaky EL element and the selected cathode line is also coupled to the leaky element, then the voltage measured on the anode line will be significantly lower than the turn-on voltage. In this case, the measured voltage will be lower than the turn-on voltage because, e.g., the leaky element allows for a greater current flow below the turn-on voltage than a non-leaky element.

After the voltages on all the anode lines $B_1$–$B_5$ are measured, then a different cathode line is selected. The voltage applied to the newly selected cathode line is 0V, and the voltage "V" is applied to the non-selected cathode lines. The anode lines $B_1$–$B_5$ are floated. Then, the voltages on the anode lines $B_1$–$B_5$ are measured. Preferably, after the new cathode line is selected (e.g., after the newly selected cathode line is grounded), there is a waiting period of a few milliseconds, preferably, 1–2 ms before the voltages on the anode lines $B_1$–$B_5$ are measured. This waiting period allows the newly selected line to adequately discharge and the non-selected lines to adequately charge. By floating the anode lines rather than applying a voltage to them, this technique is better able to screen electronic devices in a high volume production environment by avoiding the time needed to discharge and recharge the anode lines. These actions are performed for each of the remaining cathode lines so that all of the cathode lines $A_1$–$A_5$ are selected once. By performing these actions, the voltages of each of the EL elements of the display can be determined.

FIG. 4 is a table that shows exemplary measured voltages of the EL elements of the exemplary display. FIG. 4 shows the voltages for the EL elements at the intersections of the anode lines $B_1$–$B_5$ and the cathode lines $A_1$–$A_5$. For example, the voltage of the EL element at the intersection of cathode line $A_1$ and anode line $B_1$ is 2.5V (this EL element is referred to as element $E_{1,1}$). In the earlier example, since no leaky EL elements are coupled to the anode line B1, all of the elements coupled to this anode line have a voltage of approximately 2.5V which is approximately the turn-on voltage of the EL element. Similarly, since there are no leaky EL elements coupled to the anode lines $B_2$–$B_4$, all of these elements have a voltage of approximately 2.5V. The EL element $E_{2,5}$ is a leaky element and is coupled to the anode line $B_5$. When the selected cathode line is not coupled to the leaky element $E_{2,5}$, the measured voltage of the anode line B5 is approximately 3.5V which is significantly higher than the turn-on voltage. Specifically, the voltage of the following elements is approximately 3.5V: $E_{1,5}$; $E_{3,5}$; $E_{4,5}$; and $E_{5,5}$. If, however, the selected cathode line is coupled to the leaky element $E_{2,5}$, then the measured voltage of the anode line $B_5$ is approximately 1.5V (i.e., the element $E_{2,5}$ has a voltage of approximately 1.5V) which is significantly lower than the turn-on voltage.

Figure 5:
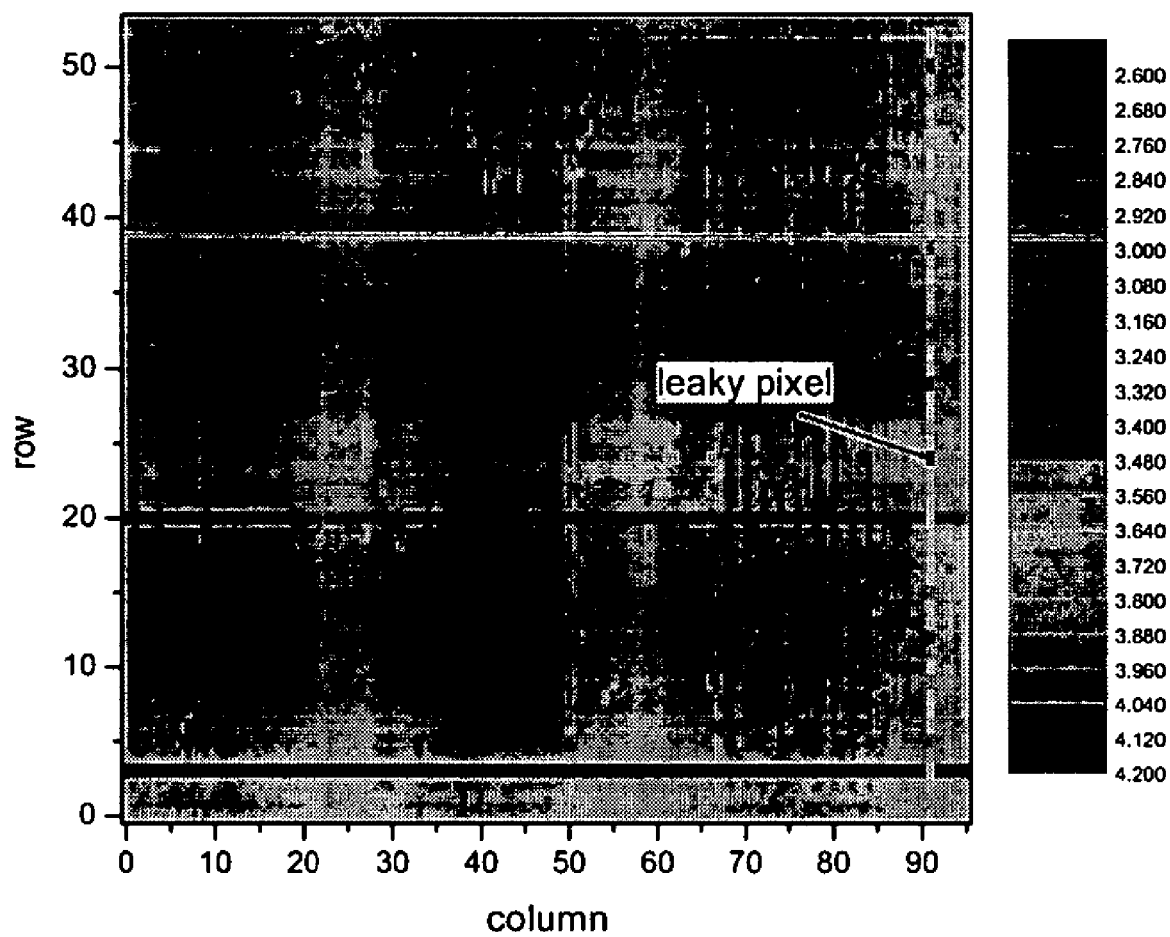
FIG. 5 graphically shows the measured voltages of the pixels of a 54 row by 96 column passive matrix OLED display.

FIG. 5 graphically shows the measured voltages of the pixels of a 54 row by 96 column passive matrix OLED display. The OLED display had the following device structure: an anode made of indium tin oxide ("ITO") was on a glass substrate; a hole transport layer made of PEDOT:PSS (i.e., polyethylenedioxythiophene and polystyrenesulfonic acid) was on the anode; an emissive layer made of polyphenelenevinylene derivatives was on the hole transport layer; and a bi-layer cathode was on the emissive layer (the cathode included a thin layer of barium and a thicker layer of aluminum). In FIG. 5, one of the columns (i.e., anode lines) is coupled to a leaky pixel. As shown in FIG. 5, the voltage of the leaky pixel is significantly lower than the voltage of any of the other elements coupled to the same column (the voltage of the leaky pixel is approximately 2.7V while the voltage of the other elements coupled to the same column is at least 3.4V).

Once the measured voltages of the elements are obtained, several different techniques can be used to identify the leaky element in the electronic device or alternatively, provide a binary answer as to whether the electronic device contains any leaky elements. The devices can be screened electrically or visually.

In one embodiment of the technique to electrically identify one or more leaky elements, an "average column voltage" of the elements coupled to a particular second line is calculated and the voltage of each of the elements coupled to the particular second line is compared to the "average column voltage" in order to determine if any of the elements coupled to the particular second line is a leaky element. In this embodiment, the "average column voltage" for the particular second line is calculated by excluding the element coupled to the particular second line having the lowest voltage. The "average column voltage" for a particular second line is calculated by first summing together the voltages of the elements coupled to the particular second line but excluding the element coupled to the particular second line having the lowest voltage. Then, the sum of voltages is divided by the number of elements coupled to the particular second line but excluding the element coupled to the particular second line having the lowest voltage. The result is the "average column voltage." Then, the voltage of each of the elements coupled to the particular second line is compared to the "average column voltage". If the "average column voltage" is significantly higher than the voltage of a particular element coupled to the particular second line, then the particular element is identified as one of the leaky elements. The "average column voltage" is considered significantly higher than the voltage of the particular element if, e.g., it is higher by at least 0.1V. Similarly, the "average column voltage" can be calculated for a different second line and the voltages of the elements coupled to the different second line are compared to this "average column voltage" to identify leaky elements. These actions can be performed for the remaining second lines so that the entire electronic device can be checked for leaky elements and the leaky elements can be identified.

For example, the voltage values for the elements specified in FIG. 4 can be used to show how a leaky element can be identified using the "average column voltage." For the anode line B1, the "average column voltage" is calculated to be 2.5V (i.e., (2.5V+2.5V+2.5V+2.5V)/4). Since the "average column voltage" is not significantly higher than any of the elements coupled to anode line $B_1$, none of the elements coupled to the anode line $B_1$ are identified as leaky elements. Similarly, none of the elements coupled to anode lines $B_2$–$B_4$ are identified as leaky elements. For the anode line $B_5$, the "average column voltage" is calculated to be 3.5V (i.e., (3.5V+3.5V+3.5V+3.5V)/4); since the element coupled to the anode line $B_5$ having the lowest voltage is excluded from the calculation of "average column voltage", therefore, the element $E_{2,5}$ is excluded from the calculation). The "average column voltage" is not significantly higher than the voltage of any of the following elements: $E_{1,5}$; $E_{3,5}$; $E_{4,5}$; and $E_{5,5}$. However, the "average column voltage" is significantly higher than the voltage of element $E_{2,5}$ (i.e., the difference is 2V), and so element $E_{2,5}$ is identified as one of the leaky elements.

Alternatively, rather than identifying the leaky element, the "average column voltage" can be used to provide a binary answer as to whether the electronic device contains any leaky elements. In this case, as is the case if identifying the leaky element, the "average column voltage" is determined for a particular second line and the voltages of the elements coupled to this second line are compared to this "average column voltage" to determine whether the electronic device contains any leaky elements. If the "average column voltage" is significantly higher than the voltage of a particular element coupled to the particular second line, then it is indicated that the electronic device contains at least one leaky element. For each of the remaining second lines, the "average column voltage" can be calculated and the voltages of each of the elements coupled to the particular second line can be compared to the "average column voltage" for the particular second line to determine whether there is a leaky element anywhere in the electronic device. When a leaky element is found, the search for leaky elements can be terminated, or alternatively, the search can be continued to determine whether there are other leaky elements in the electronic device.

Alternatively, in another embodiment of the technique to electrically identify one or more leaky elements, the voltage difference between the voltages of two adjacent elements can be used to identify the one or more leaky elements. In one configuration of this embodiment, for a particular second line "j", the voltage difference between the voltage of a selected element $E_{i,j}$ and the voltage of an adjacent element $E_{i-1,j}$ is determined (the element $E_{i-1,j}$ is adjacent to and immediately precedes the element $E_{i,j}$). If the voltage difference between the voltages of these two elements is a significant negative voltage difference, then the selected element $E_{i,j}$ is identified as a leaky element. Otherwise, if the voltage difference is a significant positive voltage difference, then the adjacent and immediately preceding element $E_{i-1,j}$ is identified as the leaky element. The voltage difference is considered to be a significant negative voltage difference if, e.g., the difference is at least −0.1V. The voltage difference is considered to be a significant positive voltage difference if, e.g., the difference is at least 0.1V. In this configuration, because the comparison is with the immediately preceding element, the first element coupled to the second line "j" is not selected (e.g., in FIG. 2, the first element is the element $E_{1,j}$ and this element is not selected because there is no immediately preceding element to which a comparison can be made). The voltage difference between other adjacent elements coupled to the second line "j" can be determined so that all of the elements coupled to the second line "j" are selected once, excluding the first element, in order to determine the voltage difference between adjacent elements for the remaining elements coupled to the second line "j". These actions can be performed for the remaining second lines so that the voltage difference between adjacent elements is determined for all of the elements of the electronic device.

For example, the voltage values for the elements specified in FIG. 4 can be used to show how a leaky element can be identified by using the voltage difference between the selected element $E_{i,j}$ and the adjacent, immediately preceding element $E_{i-1,j}$. For each of the anode lines $B_1$–$B_5$, excluding from selection the first element on the anode lines, the voltage difference between the selected element and an adjacent, immediately preceding element can be calculated. These voltage differences are shown in FIG. 6. In FIG. 6, the anode line "j" can be any one of: $B_1$, $B_2$, $B_3$, $B_4$, or $B_5$. There are significant voltage differences between the elements coupled to the anode line $B_5$. For example, the voltage difference between the selected element $E_{2,5}$ and the immediately preceding element $E_{1,5}$ is −2V. Since this is a significant negative voltage difference, then this indicates that the element $E_{2,5}$ should be identified as a leaky element. Also, the voltage difference between the selected element $E_{3,5}$ and the immediately preceding element $E_{2,5}$ is 2V. Since this is a significant positive voltage difference, then this indicates that the element $E_{2,5}$ should be identified as a leaky element.

In another configuration of this embodiment, for a particular anode line "j", the voltage difference between the voltage of a selected element $E_{i,j}$ and the voltage of an adjacent element $E_{i+1,j}$ is calculated (the element $E_{i+1,j}$ is adjacent to and immediately succeeding the element $E_{i,j}$). If the voltage difference between the voltages of these two elements is a significant negative voltage difference, then the immediately succeeding element $E_{i+1,j}$ is identified as a leaky element. Otherwise, if the voltage difference is a significant positive voltage difference, then the selected element $E_{i,j}$ is identified as the leaky element. In this configuration, because the comparison is with the immediately succeeding element, the last element coupled to the anode line "j" is not selected (e.g., in FIG. 2, the last element is the element $E_{5,j}$ and this element is not selected because there is no immediately succeeding element to which a comparison can be made).

Figure 7:
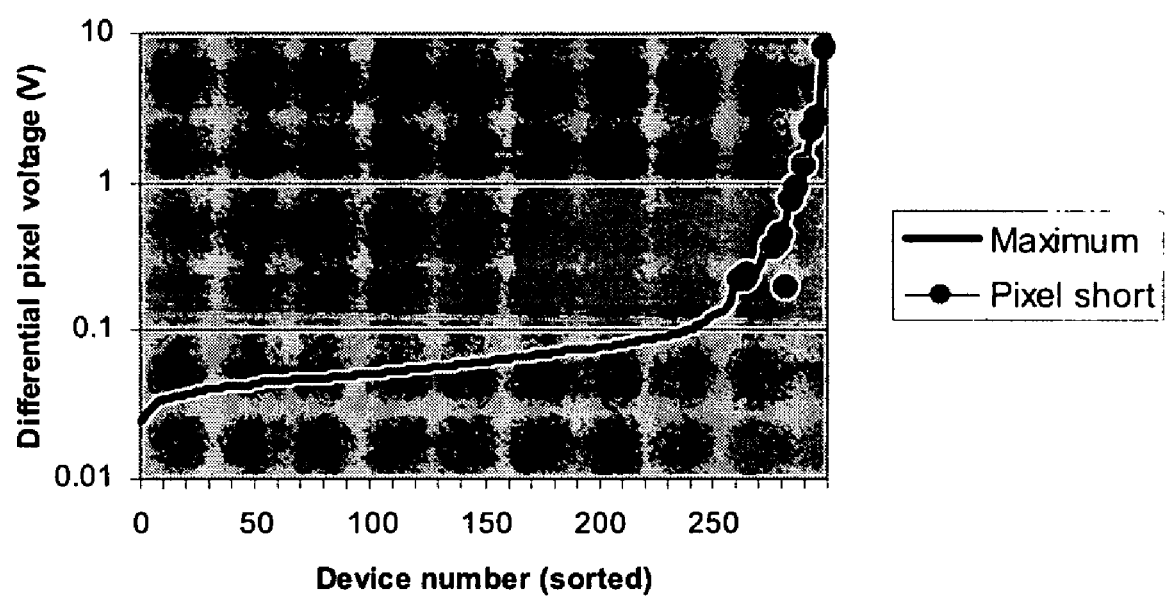
FIG. 7 graphically shows the maximum differential voltage of 300 randomly selected passive matrix OLED displays and also shows those displays that developed a pixel short after operating for 400 hours at 70° C.

FIG. 7 graphically shows the maximum differential voltage of 300 randomly selected passive matrix OLED displays and also shows those displays that developed a pixel short after operating for 400 hours. The displays had the device structure described earlier for FIG. 5. At zero operating hours, the voltage difference of each of the pixels of each of the 300 displays was determined. The maximum voltage difference for each of the displays is shown in FIG. 7. The displays are ordered based on the maximum voltage difference where the display with the lowest maximum voltage difference is labeled as the first display and the display with the highest maximum voltage difference is labeled as the $300^{th}$ display. The displays were operated at 70° C. for 400 hours which is the equivalent of several thousands of operating hours at room temperature. After operating them for 400 hours, the displays were tested and some of them contained pixel shorts. The dots in FIG. 7 specify those displays that contained at least one pixel short. Only a small percentage of the displays developed a pixel short and of these displays, only the displays whose maximum voltage difference was above 0.2V developed the pixel short. This shows that the differential voltages can be used to accurately predict whether a display is likely to later develop a pixel short.

Alternatively, rather than identifying the leaky element, the voltage difference between adjacent elements can be used to provide a binary answer as to whether the electronic device contains any leaky elements. In this case, as is the case if identifying the leaky element, the voltage differences between adjacent elements coupled to a particular second line are determined. If the voltage difference between adjacent elements is a significant voltage difference, then it is indicated that the electronic device contains at least one leaky element. The voltage difference is considered to be a significant voltage difference if the absolute value of the voltage difference is at least 0.1V. The voltage difference between adjacent elements can be determined for each of the remaining second lines in order to determine whether there is a leaky element in the entire electronic device. When a leaky element is found, the search for leaky elements can be terminated, or alternatively, the search can be continued to determine whether there are other leaky elements in the electronic device.

Alternatively, rather than measure the voltages of each of the elements of the display, visual detection can be used to identify one or more leaky elements or to provide a binary answer as to whether the display contains any leaky elements. The visually screening technique includes performing the following actions: selecting one of the first lines; applying a first voltage to the selected first line; applying a second voltage to the one or more of the first lines that is not selected; floating the second lines; and then visually determining if one or more of the EL elements coupled to the selected first line emits light. If one of the elements is a leaky element, then current will flow through the leaky element. In this case, if the selected first line is not coupled to the leaky element, then the leaky current will cause the emission of light from the element that is coupled to the selected first line and also coupled to the same second line as the leaky element. The intensity of the emitted light depends on the magnitude of the leakage current. If, however, the selected first line is coupled to the leaky element, then the leaky element will not emit light. After all of the first lines have been selected, a leaky element can be identified as the element that did not emit light when the first line it is coupled to was selected but all other elements coupled to the same second line emitted light when their corresponding first line was selected.

A specific example can be shown using the display of FIG. 2. In FIG. 2, the EL element $E_{2,5}$ is a leaky element. The selected cathode line "$A_3$" is grounded, while a voltage "V" (e.g., 12V) is applied to all of the non-selected cathode lines (e.g., the non-selected cathode lines are $A_1$, $A_2$, $A_4$, and $A_5$). The anode lines $B_1$–$B_5$ are floated. Since the element $E_{2,5}$ is a leaky element, current will flow through the element causing the anode line $B_5$ to have a voltage higher than the turn-on voltage of the EL element. Thus, element $E_{3,5}$ will emit light. During other scanning periods, when the cathode lines $A_4$, $A_5$, and $A_1$ are selected, the corresponding elements coupled to the same anode line as the leaky element, namely, elements $E_{4,5}$, $E_{5,5}$, and $E_{1,5}$ respectively will emit light. However, when the cathode line $A_2$ is selected, then the element $E_{2,5}$ will not emit light since this line is grounded so there will only be minimal if any leaky current traveling through the element. Since all of the elements coupled to the anode line $B_5$ emit light when the element's corresponding cathode line is selected except for the element $E_{2,5}$, therefore, it can be concluded that the element $E_{2,5}$ is a leaky element and the element $E_{2,5}$ is identified as a leaky element.

Alternatively, rather than identifying the leaky element, the visual detection can be used to provide a binary answer as to whether the display contains any leaky elements. In this case, as is the case if specifically identifying the leaky element, the following actions are performed: one of the first lines is selected; a first voltage is applied to the selected first line; a second voltage is applied to the one or more of the first lines that is not selected; the second lines are floated; and then it is visually determined if one or more of the EL elements coupled to the selected first line emits light. These actions are performed for each of the first lines so that all of the first lines are selected once. During testing, if it is observed that one of the elements emits light, then it can be concluded that the electronic device has a leaky element. Upon observing the emission of light, the test can be terminated, or alternatively, the testing can continue until all the first lines are selected once and it is observed whether any of the elements coupled to the selected first line emit light.

Alternatively, optical detection, using the array of infrared sensors (e.g., an array of thermal detectors), can be used to identify one or more leaky elements in the electronic device. The optical screening technique includes performing the following actions: selecting one of the first lines; applying a first voltage to the selected first line; applying a second voltage to the one or more of the first lines that are not selected; and floating the second lines. These actions are repeated so that each of the first lines are selected multiple times. During this time, the array of infrared sensors takes multiple measurements of a certain characteristic of the elements. Specifically, for example, the array of infrared sensors can be an array of thermal detectors and the measured characteristic can be the temperature of the elements. In this case, the multiple temperature measurements are averaged so that each of the elements has a corresponding average measured temperature. A leaky element has an average measured temperature that is significantly higher than that of any of the other elements coupled to the same second line as the leaky element.

Using the measured voltages of each of the elements, other parameters can also be calculated. For example, a "device voltage" can be calculated where this parameter is the average voltage of the elements of the device. For example, using the voltage values specified in FIG. 4, the "device voltage" for the exemplary display is 2.6V (e.g., this is computed by summing together the voltage values of the elements and then dividing the sum by the number of elements in the device). In addition, an "element inconsistency" parameter can be calculated for a particular element. This parameter is the standard deviation of different voltage measurements of the same element. The "element inconsistency" parameter can be used to determine the stability of the particular element.

Alternatively, rather than selecting only one of the first lines during a particular scanning period, two or more first lines can be selected at the same time during the particular scanning period. If two or more first lines are selected during a particular scanning period, a binary answer can be provided as to whether the electronic device contains at least one leaky element.

As any person of ordinary skill in the art of electronic device fabrication and encapsulation will recognize from the description and figures that modifications and changes can be made to the embodiments of the invention without departing from the scope of the invention.

What is claimed:

1. A method to detect leaky elements in a matrix-structured electronic device, wherein said device includes a plurality of elements, a plurality of first lines, and a plurality of second lines, wherein said plurality of first lines intersect said plurality of second lines, and said plurality of elements are at said intersections and are coupled to said plurality of first lines and said plurality of second lines, said method comprising:
    (a) selecting a particular one of said plurality of first lines;
    (b) applying a first voltage to said particular first line that is selected;
    (c) applying a second voltage to one or more of said plurality of first lines that are not selected;
    (d) floating said plurality of second lines; and
    (e) measuring a plurality of voltages on said plurality of second lines, each of said plural measured voltages identifying a particular one of said plural elements which is coupled to both a corresponding selected first line and the corresponding second line.

2. The method of claim 1 further comprising
    (f) assigning said plurality of voltages to corresponding ones of said plurality of elements that are at intersections of said selected first line and said plurality of second lines.

3. The method of claim 1 wherein said first voltage is significantly lower than said second voltage.

4. The method of claim 1 wherein said first voltage is 0V and said second voltage is greater than 6V.

5. The method of claim 1 wherein said matrix-structured electronic device is an OLED display, and said plurality of elements is a plurality of pixels.

6. A method to detect leaky elements in a matrix-structured electronic device, wherein said device includes a plurality of elements, a plurality of first lines, and a plurality of second lines, wherein said plurality of first lines intersect said plurality of second lines, and said plurality of elements are at said intersections and are coupled to said plurality of first lines and said plurality of second lines, said method comprising:
- (a) selecting a particular one of said plurality of first lines;
- (b) applying a first voltage to said particular first line that is selected;
- (c) applying a second voltage to one or more of said plurality of first lines that are not selected;
- (d) floating said plurality of second lines;
- (e) measuring a plurality of voltages on said plurality of second lines;
- (f) assigning said plurality of voltages to corresponding ones of said plurality of elements that are at intersections of said selected first line and said plurality of second lines; and performing steps (a) thru (f) for each of remaining first lines of said plurality of first lines so that all of said plurality of first lines are selected once in part (a).

7. The method of claim 6 further comprising identifying one or more of said plurality of elements that are leaky elements.

8. The method of claim 7 wherein identifying said one or more leaky elements includes
- (h) for a particular one of said plurality of second lines, determining a particular one of said plurality of elements coupled to said particular second line that has a corresponding one of said plurality of voltages that is a lowest voltage value;
- (i) determining an average column voltage by;
  - (i) summing said plurality of voltages corresponding to those elements coupled to said particular second line but excluding said particular element having said lowest voltage value;
  - (ii) determining a number of said plurality of elements coupled to said particular second line but excluding said particular element having said lowest voltage value;
  - (iii) dividing said summed voltage value by said number to calculate said average column voltage;
- (j) determining if said average column voltage is significantly greater than a particular one of said plurality of voltages corresponding to a particular one of said plurality of elements coupled to said particular second line; and
- (k) if said average column voltage is significantly higher than a particular one of said plurality of voltages corresponding to a particular one of said plurality of elements coupled to said particular second line, then identifying said particular element as one of said one or more leaky elements.

9. The method of claim 8 further comprising
- (l) performing parts (j) that (k) for each of remaining elements of said plurality of elements coupled to said particular second line so that all of said plurality of elements coupled to said particular second line are selected once.

10. The method of claim 9 further comprising performing parts (h) thru (l) for each of remaining second lines of said plurality of second lines so that all of said plurality of second lines are selected once.

11. The method of claim 6 further comprising indicating whether said matrix-structured electronic device includes at least one leaky element by for a particular one of said plurality of second lines, determining a particular one of said plurality of elements coupled to said particular second line that has a corresponding one of said plurality of voltages that is a lowest voltage value;

determining an average column voltage by:
  summing said plurality of voltages corresponding to those elements coupled to said particular second line but excluding said particular element having said lowest voltage value;
  determining a number of said plurality of elements coupled to said particular second line but excluding said particular element having said lowest voltage value;
  dividing said summed voltage value by said number to calculate said average column voltage;

determining if said average column voltage is significantly greater than a particular one of said plurality of voltages corresponding to a particular one of said plurality of elements coupled to said particular second line; and if said average colunm voltage is significantly higher than a particular one of said plurality of voltages corresponding to a particular one of said plurality of elements coupled to said particular second line, then indicating that said matrix-structured electronic device includes at least one leaky pixel.

12. The method of claim 8 wherein said average column voltage is significantly higher than said particular element voltage if said average column voltage is higher than said particular element voltage by at least 0.1V.

13. The method of claim 7 wherein identifying said one or more leaky elements includes for a particular one of said plurality of second lines, determining a voltage difference between a particular one of said plurality of voltages corresponding to a particular one of said plurality of elements coupled to said particular second line and another one of said plurality of voltages corresponding to another one of said plurality of elements that is adjacent to said particular element and is also coupled to said particular second line.

14. The method of claim 13 wherein said other one of said plurality of elements that is adjacent to said particular element is a particular one of said plurality of elements that is coupled to said particular second line and is adjacent to and immediately precedes said particular element, and
- (o) wherein said voltage difference is determined between said particular one of said plurality of elements coupled to said particular second line and said particular one of said plurality of elements that is coupled to said particular second line and is adjacent to and immediately precedes said particular element; and further comprising
- (p) if said voltage difference between said particular voltage and said other voltage is a significant negative voltage difference, then identifying said particular element as one of said one or more leaky elements, otherwise, if said voltage difference is a significant positive voltage difference, then identifying said immediately preceding element that is adjacent to said particular element as one of said one or more leaky elements.

15. The method of claim 14 further comprising
- (q) excluding a particular one of said plurality of elements coupled to said particular second line that is a first element of said particular second line, performing parts (o) and (p) for all other remaining elements of said plurality of elements that are coupled to said particular second line.

16. The method of claim 15 further comprising
performing part (q) for each of remaining second lines of said plurality of second lines so that said voltage difference is determined for elements coupled to all of said plurality of second lines.

17. The method of claim 6 further comprising indicating whether said matrix-structured electronic device includes at least one leaky element by
for a particular one of said plurality of second lines, determining a voltage difference between a particular one of said plurality of voltages corresponding to a particular one of said plurality of elements coupled to said particular second line and another one of said plurality of voltages corresponding to another one of said plurality of elements that is coupled to said particular second line and is adjacent to and immediately precedes said particular element; and if said voltage difference between said particular voltage and said other voltage is a significant voltage difference, then indicating that said matrix-structured electronic device includes at least one leaky element.

18. The method of claim 14 wherein said significant negative voltage difference is at least −0.1V, and said significant positive voltage difference is at least 0.1V.

19. The method of claim 6 wherein said first voltage is significantly lower than said second voltage.

20. The method of claim 6 wherein said first voltage is 0V and said second voltage is greater than 6V.

21. The method of claim 6 wherein said matrix-structured electronic device is an OLED display, and said plurality of elements is a plurality of pixels.

* * * * *